(12) United States Patent
Lewis et al.

(10) Patent No.: US 6,661,361 B1
(45) Date of Patent: Dec. 9, 2003

(54) HIGH SPEED OPTICAL ANALOG TO DIGITAL CONVERTER AND DIGITAL OPTICAL WAVEMETER

(75) Inventors: Meirion F. Lewis, Malvern (GB); Alan Johnstone, Malvern (GB)

(73) Assignee: Qinetiq Limited, Farnborough (GB)

(*) Notice: Subject to any disclaimer, the term of this patent is extended or adjusted under 35 U.S.C. 154(b) by 0 days.

(21) Appl. No.: 09/980,276

(22) PCT Filed: Jun. 2, 2000

(86) PCT No.: PCT/GB00/02126

§ 371 (c)(1),
(2), (4) Date: Apr. 23, 2002

(87) PCT Pub. No.: WO00/75721

PCT Pub. Date: Dec. 14, 2000

(30) Foreign Application Priority Data

Jun. 2, 1999 (GB) ............................................. 9912687

(51) Int. Cl.$^7$ ............................. H03M 1/00; H03M 1/60
(52) U.S. Cl. ....................................... 341/137; 341/155
(58) Field of Search ................................ 341/137, 155; 324/96; 359/278, 107; 332/117; 356/452, 455, 491; 372/32

(56) References Cited

U.S. PATENT DOCUMENTS

| | | | | |
|---|---|---|---|---|
| 4,694,276 A | * | 9/1987 | Rastegar | 341/137 |
| 4,928,007 A | * | 5/1990 | Furstenau et al. | 341/137 |
| 5,523,838 A | * | 6/1996 | Nagashima | 356/452 |
| 5,576,834 A | * | 11/1996 | Hamada | 356/452 |
| 6,404,366 B1 | * | 6/2002 | Clark et al. | 341/137 |

FOREIGN PATENT DOCUMENTS

GB    1 578 586    11/1980

OTHER PUBLICATIONS

Patent Abstracts of Japan, vol. 013, No. 463, Oct. 19, 1989 & JP 01 181326, Jul. 19, 1989.

Patent Abstracts of Japan, vol. 011, No. 181, Jun. 11, 1987 & JP 62 011834, Jan. 20, 1987.

Jalali et al, "Optical Folding–Flash Analog–to–Digital Converter with Analog Encoding" Optics Letters, US Optical Society of America, Washington, vol. 20, No. 18, Sep. 15, 1995, pp. 1901–1903.

* cited by examiner

*Primary Examiner*—Patrick Wamsley
(74) *Attorney, Agent, or Firm*—Nixon & Vanderhye P.C.

(57) ABSTRACT

An optical analogue to digital (A/D) converter for converting an input analogue voltage signal into a digital output, comprising means for frequency modulating an optical signal with an input analogue voltage signal, delay means for splitting the frequency modulated optical signal and generating at least one differentially delayed signal and at least one reference signal, at least one combining means arranged to combine the or one of the delayed optical signals with the or one of the reference signals, and at least one converter means for converting a combined signal output from an associated one of the combining means to a digital code. Also provided is a digital optical wavemeter for generating a digital representation of the wavelength of an input optical signal, comprising delay means for splitting the input optical signal and generating at least one differentially delayed optical signal and at least one reference signal, at least one combining means arranged to combine the or one of the delayed optical signals with the or one of the reference signals, and at least one converter means for converting a combined signal output from an associated one of the combining means to a digital signal.

52 Claims, 9 Drawing Sheets

| BIT ACCURACY N | F<sub>MAX</sub>(GHz) |
|---|---|
| 2 | 1124 |
| 3 | 398 |
| 4 | 140 |
| 5 | 50 |
| 6 | 17.6 |
| 7 | 6.2 |
| 8 | 2.2 | ular
HIGH SPEED OPTICAL ANALOG TO DIGITAL CONVERTER AND DIGITAL OPTICAL WAVEMETER

BACKGROUND OF THE INVENTION

1. Field of the Invention

The present invention relates to an improved optical analog to digital (A/D) converter which is able to achieve a high conversion rate and to a digital optical wavemeter which is able to generate a direct digital output of optical frequency at high measurement rates.

2. Discussion of Prior Art

The processing of signals is preferably carried out in the digital domain because digital processing is fast, accurate and reliable. However, where a system involves the reception of analogue waveforms, such as radio or microwave systems, radar systems and current television systems, it is necessary to employ an A/D converter to convert signals from the analogue to the digital domain. Currently, the performance, in particular the speed and resolution, of A/D converters is the limiting factor in the performance of certain systems, in particular radar.

The majority of known AND converters use electronic components which operate at radio frequencies (rf). Monolithic electronic A/D converters which can achieve speeds of 1 GSa/s at 8 bit accuracy are just becoming available. It has long been recognised that higher sampling rates are potentially achievable using A/D converters employing optical components.

One approach to optical A/D conversion is outlined in a paper entitled "Fibre and integrated optic devices for signal processing" which was published by H. F. Taylor in Proc SPIE Vol 176 (1979) pp 17–27. This approach uses mode locked lasers to provide fast sampling of the input analogue signal, uses optical detectors as sample and hold circuits and exploits the periodic response of integrated optic Mach-Zehnder modulators. The analogue input voltage to be digitised is applied simultaneously to the electrodes of each of a plurality of modulators and the lengths of the electrodes on successive modulators vary in a binary sequence. The response of each modulator varies sinusoidally with input voltage, with a period dependent on the length of the electrode. The outputs of each of the modulators is fed via photodetectors to an electronic comparator in order to generate a binary output varying periodically with input voltage. If the input voltage is fed to an array of such devices whose periodicities are arranged in a binary sequence, the output from the array of comparators forms a parallel binary representation of the input voltage in conventional or Gray Code format. A variation of this type of device is disclosed in U.S. Pat. No. 4,947,170.

A simplified A/D converter of this type is disclosed in EP 319, 286, in which a single Mach-Zehnder interferometer is used and signals are tapped off from different parts of the arms of the interferometer between successive stages of electrodes. U.S. Pat. No. 4,694,276 utilises a multiple wavelength optical source as a sampling source in order to provide higher bit resolution for a set number of interferometers. U.S. Pat. No. 5,381,147 uses a double frequency optical source to input a different frequency of light into the two arms of the interferometers, in order to provide an inherent frequency down conversion.

One problem with these types of device is the difficulty of making the array of modulators have sufficiently reproducible responses using the electro-optic effect to generate accurate relative phase changes, especially if an array of 8 of them is required to provide 8 bit resolution. Another difficulty concerns the power level of the input analogue voltage signal which has to be high enough to drive a plurality of electro-optic devices.

SUMMARY OF THE INVENTION

A digital optical wavemeter will generate a digital representation of the wavelength or equivalently the frequency of an input optical signal. They are used, for example to test the wavelength stability of a laser or to measure the frequency variation or CHIRP of an amplitude modulated laser diode. One type, uses a scanning Michelson interferometer and has a measurement rate of the order of 1 Hz. There is a requirement for an optical wavemeter that can operate at higher measurement rates.

According to a first aspect of the present invention, there is provided an optical analogue to digital (A/D) converter for converting an input analogue voltage signal into a digital output, comprising:

means for frequency modulating an optical signal with an input analogue voltage signal, delay means for splitting the frequency modulated optical signal and generating at least one differentially delayed signal and at least one reference signal, at least one combining means arranged to combine the or each differentially delayed signal with the or one of the reference signal(s), and at least one converter means for converting a combined signal output from an associated one of the combining means to a digital output.

The amplitude of the or each combined signal will vary sinusoidally with the frequency of the frequency modulated optical signal which is input into the delay means and so will vary sinusoidally with the input analogue voltage, provided the optical frequency varies linearly with analogue voltage. The periodicity of this sinusoidal response is dependent on the length of the relative delay between the delayed optical signal and the reference optical signal with which it is combined. For example, by using the delay means to generate a plurality of differentially delayed signals and the combining means to combine them with a reference signal, a plurality of input analogue voltage dependent sinusoidal responses is generated with differing periodicities. Converter means convert each sinusoidal response into a digital electrical response. The differential delays can be chosen so that the output from each converter means represents at least one bit of a multi-bit output representative of the input analogue voltage so that the combined output of the converter means provides a direct digital representation of the input analogue voltage. In this way the present invention utilises the frequency modulation of optical signals to provide a high speed A/D converter. Conversion rates and resolutions shown in the table in FIG. 10 can be achieved, assuming a 1% laser tuning range and other issues which are covered later. The delay means and the combining means should preferably preserve the polarization of the delayed and reference signals so that on combination of the delayed and reference signals either destructive or constructive interference occurs.

Preferably, the means for frequency modulating an optical signal with an input analogue voltage signal comprises a frequency tunable laser, preferably a singlemode semiconductor laser diode, which generates an optical signal with a frequency related, preferably linearly, to an input analogue voltage tuning signal. The input analogue voltage signal to be converted to digital form is used to frequency tune the laser and so generate a frequency modulated optical signal with a frequency directly related to the input voltage level. Thus, according to this preferred embodiment of the present invention the input voltage only has to drive the tuning of the laser and not a plurality of electro-optic phase shifters, as in known devices.

Preferably the converter means comprises at least one comparator means for comparing a combined signal output from an associated one of the combining means to a reference value and generating a 0 or a 1.

An advantage of the present invention over some known electrical analogue to digital converters is the need for relatively few comparators. This is especially true relative to state of the art flash analogue to digital converters.

Preferably, the delay means comprises at least one interferometer having a first arm for generating a reference signal and a second arm for generating at least one differentially delayed signal. More preferably, the delay means comprises a plurality of interferometers each having a first arm for generating a reference signal and a second arm for generating a differentially delayed signal. The interferometer structure can easily be implemented using optical fiber or more preferably using optical waveguides formed in an integrated optical substrate. The light could be split between the delay means and at the input of each delay means using, for example, Y-junctions, coupled waveguide or multimode interference splitters.

The combining means must cause a delayed and a reference signal to interfere constructively or destructively dependent on their relative optical phase and may, for example comprise Y-junctions, coupled waveguides or multimode interference recombiners in integrated optic structures. The output of the combining means is typically fed to a photo detector to convert the optical signal output from the combining means into an electrical signal for conversion to digital form.

The delay means may also comprise at least one electro-optic phase shifter for the fine tuning of differentially delayed signals and/or reference signals. This can improve the performance of the A/D converter according to the present invention, for example by offsetting manufacturing errors or compensating for temperature changes.

Compensatory delay means may be included in the A/D converter in order to compensate for the delays generated by the delay means, such that the combined signals are input into the converter means substantially simultaneously. This also means that the converter means, for example a converter means which comprises one or more comparator means, can be synchronised very simply using a single clock control. Any clock control for the converter or comparator means can be located externally of the A/D converter and so the operation of the AND converter can be easily synchronised with other components controlled by the same clock control.

Where there are more than one combining means, the combined signal outputs of the combining means have different frequencies, preferably successively doubling frequencies.

In order to generate a binary digital output each successive differential delay is substantially double the previous delay.

In designing an analogue to digital converter. according to the present invention the central frequency $v_0$ of the frequency modulated optical signal, the frequency range $\Delta v$ of the frequency modulated optical signal and the differential time delays $t_1, \ldots, t_n$ have to be set to provide the required digital output format, for example Gray Code format (Gray code format is discussed in the publication entitled "The Art of Electronics" by Paul Horowitz and Winfield Hill at Chapter 8, page 471).

By way of example, if a Gray Code output is required in which the output from each combining means represents and is converted to one bit of a parallel digital output, the successive differential delays, $t_1, t_2, t_3, t_4, \ldots t_n$ are preferably set as follows:

$t_1 = 1/2\Delta v$ $t_2 = 1/\Delta v$ $t_3 = 2/\Delta v$ $t_4 = 4/\Delta v$ $t_n = 2^{n-2}/\Delta v$ and the following condition is satisfied:

$v_1/\Delta v$ or $v_2/\Delta v$ is an integer,
where $v_1 = v_0 - \Delta v/2$,
$v_2 = v_0 + \Delta v/2$,
$v_0$ = the central frequency of the frequency modulated optical signal,
$\Delta v$ = the variation in frequency about the central frequency of the frequency modulated optical signal.

If $v_1/\Delta v$ is an even integer all the single bit outputs from the analogue to digital converter will have to be inverted to obtain a Gray Code output and if $v_1/\Delta v$ is an odd integer all the single bit outputs except the most significant bit output from the converter means of the analogue to digital converter will have to be inverted to obtain a Gray Code output.

Alternative ways to generate differentially delayed optical signals can be used. One way is to use multiple reflections of light between two faces of a block, eg. of glass, by causing the light to undergo total internal reflection except when a delayed output is required, in which case a fraction of the light is coupled out of the block.

In a preferred embodiment the output of each interferometer may comprise a coupled waveguide output, the two outputs of the coupled waveguide may be detected by separate, preferably matched, photodiode detectors, and the output of the separate photodiode detectors may be compared with each other by comparator means. This makes the output insensitive to slow variations in the power of the frequency modulated optical signal, since such variations affect both detected outputs.

For improved robustness and temperature stabilization, it is preferred that at least part of the device is formed on an integrated optic substrate.

According to a second aspect of the present invention there is provided a method of analogue to digital (A/D) conversion, comprising the steps of:

frequency modulating an optical signal with an input analogue voltage signal, splitting the optical signal and generating at least one differentially delayed signal and at least one reference signal, combining the or each delayed optical signal with the or one of the reference signal or signals to generate a combined signal or signals, and converting the or each combined signal into a digital signal.

Preferably, each successive differential delay is substantially double the previous delay and by choosing the differential delays appropriately a Gray Code or Standard Binary Code output can be generated by the method.

According to a third aspect of the present invention there is provided a digital optical wavemeter for generating a digital representation of the frequency of an input optical signal, comprising:

delay means for splitting the input optical signal and generating at least one differentially delayed optical signal and at least one reference signal, at least one combining means arranged to combine the or each delayed optical signal with the or one of the reference signals, and at least one converter means for converting a combined signal output from an associated one of the combining means to a digital output.

The wavemeter generates a direct digital representation of the frequency of the input optical signal in the same way as the A/D converter according to the first aspect of the present invention generates a digital representation of the frequency of the frequency modulated optical signal. Thus, the wavemeter according to this third aspect of the present invention has the same preferred features as the A/D converter according to the first aspect of the present invention, except of course the wavemeter does not require means, such as a frequency tunable laser to generate a frequency modulated optical signal.

According to a fourth aspect of the present invention there is provided a method for generating a digital representation of the frequency of an input optical signal, comprising the steps of:

splitting the input optical signal and generating at least one differentially delayed signal and at least one reference signal, combining the or each delayed optical signal with the or one of the reference signals to generate at least one combined signal, and converting the or each combined signal into a digital signal.

This method generates a digital representation of the frequency of the input optical signal in the same way as the method according to the second aspect of the present invention generates a digital representation of the frequency of a frequency modulated optical signal. Thus, the method according to this fourth aspect of the present invention has the same preferred features as the method according to the second aspect of the present invention, except of course the method according to this fourth aspect does not require means, such as a frequency tunable laser to generate a frequency modulated optical signal.

BRIEF DESCRIPTION OF THE DRAWINGS

The present invention will now be described, by example only, with reference to the accompanying Figures in which;

FIG. 8b shows the output generated by the four comparators of the arrangement shown in FIG. 6 from the respective input of FIG. 8a.

DETAILED DISCUSSION OF EMBODIMENTS

Figure 1:
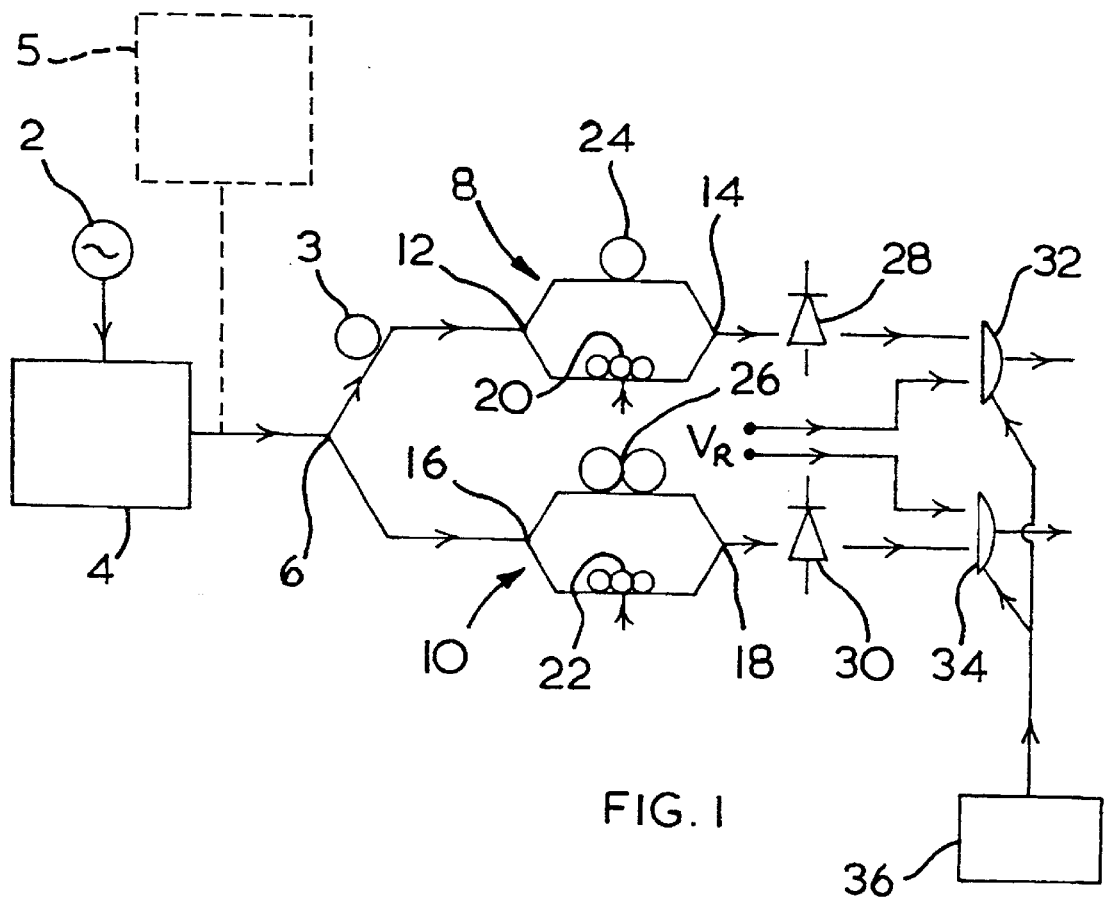
FIG. 1 shows schematically a two bit optical A/D converter according to the present invention.

In FIG. 1, an analogue electrical voltage signal input (2) which is to be converted into a digital signal is used to frequency modulate a voltage tunable laser (4). The frequency of the light output from the laser (4) is substantially linear with the input voltage level from the analogue electrical signal input (2).

The laser (4) is run continuously (cw) and the output of the laser is split using a 50/50 fibre optic coupler (6) into two Mach-Zehnder interferometers (8, 10). The interferometers (8) and (10) are made using 50/50 fibre optic couplers (12, 14) and (16, 18) respectively. The couplers are standard single mode fused couplers which do not preserve polarisation. Because of this a polarisation controller (20) is introduced in one arm of interferometer (8) and a polarisation controller (22) is introduced in one arm of interferometer (10). The polarisation controllers (20, 22) are required to ensure that the light beams which are recombined in respective couplers (14, 18) have the same polarisation and so will undergo constructive or destructive interference. Alternatively, the 50/50 fibre optic couplers could be replaced by devices that preserve polarisation, such as integrated optic waveguide devices or polarisation maintaining fibre optic couplers, in which case polarisation controllers (20, 22) would not be required.

The interferometers (8, 10) are made so that there is a differential delay in the two pathlengths through each interferometer. This differential delay varies in a binary sequence between interferometer (8) and interferometer (10), in that, the differential delay in interferometer (10) is twice that in interferometer (8).

The differential delays are created by fusion splicing the correct lengths of singlemode optical fibre in one of the arms of the interferometers (8, 10). In this way a differential delay close to 1 ns (in practice 1.019 ns) was introduced into one arm of interferometer (8) (represented in FIG. 1 by a single fibre loop (24)) and a differential delay close to twice that in interferometer (8) (in practice 2.036 ns) was introduced into one arm of interferometer (10) (represented in FIG. 1 by a double fibre loop (26)).

The output of each of the interferometers (8, 10) is detected by a respective photodiode (28, 30).

To ensure that the average delay applied to the optical signals incident on the photo detectors (28) and (30) are the same an appropriate pre-delay, represented by loop (3) can be applied to the optical signal entering interferometer (8).

Thus, the input analogue voltage to be converted into digital format from the source (2) is used to generate a frequency modulated optical output signal from the laser (4) such that the frequency of the signal output from the laser (4) is dependent on the voltage of the electrical signal from the source (2). This frequency modulated optical signal is then split at (6) into the two Mach Zehnder interferometers (8) and (10). In interferometer (8) the input optical signal is further split into the two arms of the interferometer (8). The light going through the upper arm is delayed by delay (24) with respect to the light going through the lower arm and then the signals from the two arms are combined at (14). The delay in the upper arm will generate a relative phase change between the two signals and depending on this relative phase change the signals will combine constructively or destructively at (14) to generate a combined signal which has an amplitude dependent on the relative phase change. Thus, as the frequency of the input optical signal is varied slowly the relative phase change generated by the differential delay (24) will vary to generate a combined signal from the interferometer (8) which varies sinusoidally with the frequency of the frequency modulated optical signal. Thus, the combined signal from the interferometer (8) varies sinusoidally with the amplitude of the input analogue voltage, provided the relationship between the input analogue voltage and the output frequency modulated signal from the laser (4) is linear. The period of this sinusoidal response is dependent on the length of the delay (24). A similar sinusoidal response with input voltage is generated from the output of interferometer (10), except that the period of the sinusoidal response from interferometer (10) is half of that from interferometer (8) due to the differential delay (26) in interferometer (10) being twice the differential delay (24) in interferometer (8).

Figure 2:
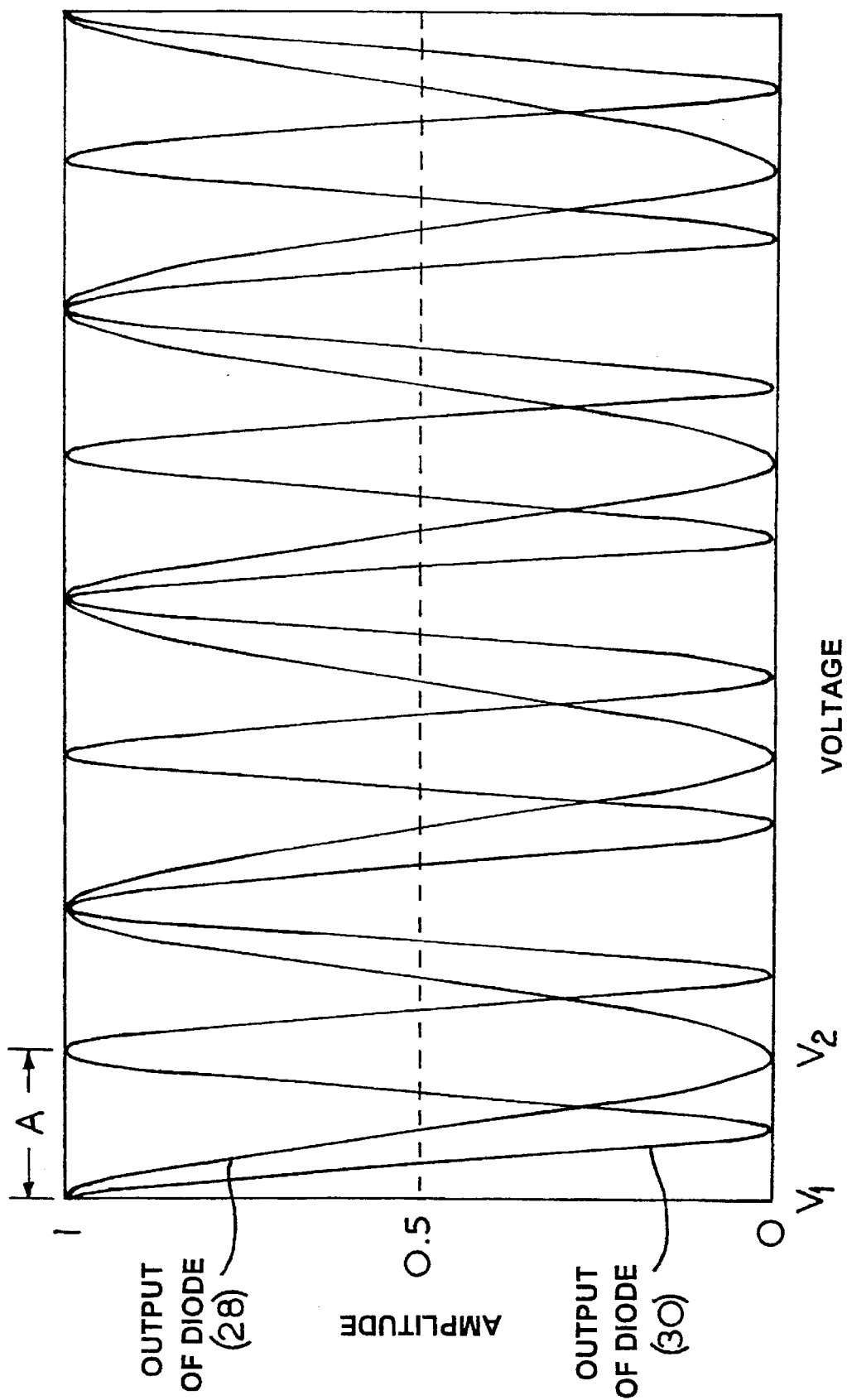
FIG. 2 shows the outputs from the photodiodes, when a steadily increasing analogue voltage V is used to tune the tunable laser of FIG. 1.

In FIG. 2 the amplitude of the voltage output of the photodiodes (28, 30) is plotted against the analogue voltage signal used to frequency tune the laser (4). It can be seen from FIG. 2 that the output of the photodiodes have frequencies in a ratio of 2:1. FIG. 2 shows the excellent tracking over several cycles of the output voltage from the photodiodes, which is one of the attractions of the analogue to digital converter according to the present invention. In practice, at most only one complete cycle could be used in the analogue to digital conversion of a limited range of input analogue voltage. Increasing the resolution of the analogue to digital converter by adding further interferometers increases this range. In FIG. 2 for example, the part of a complete cycle represented by the range A could be used in the analogue to digital conversion of an input analogue voltage which fell within a limited voltage range in this case $V_1$ to $V_2$.

As demonstrated in FIG. 2, the output of the photodiodes (28, 30) vary sinusoidally with input analogue voltage levels, as the relative phase difference between the signals through the two arms of the interferometers change with laser frequency. The period of this sinusoidal response depends on the length of the differential path delay introduced into one of the interferometer arms. The longer the differential delay, the higher the frequency of the signal output from the relevant photodiode. Then using comparators (32, 34) the outputs from the photodiodes can each be converted into one bit digital code.

The output of the photodiodes (28) and (30) are compared at respective comparators (32, 34) against a reference level set in this embodiment at the mid-point of the sinusoidal output from the photodiodes (28, 30) (eg. for the output in FIG. 2, the reference level could be set at the 0.5 amplitude level). The output of a comparators is a 1 when the output voltage from the associated photodiode is greater than the reference level and a 0 when the output level from the associated photodiode is less than the reference level. The comparators may be controlled by an external clock (36).

Figure 3A:
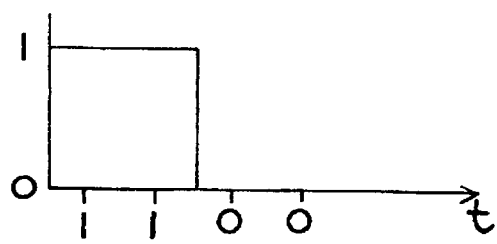
FIG. 3a shows the most significant bit (MSB) digital output of the first comparator of FIG. 1, corresponding to the output of the corresponding photodiode in section A of FIG. 2.
Figure 3B:
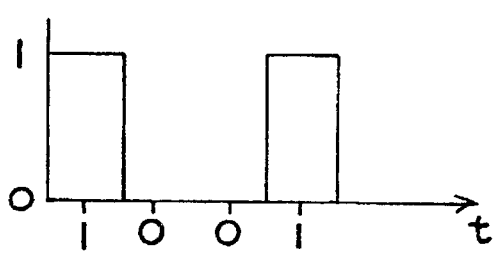
FIG. 3b shows the least significant bit (LSB) digital output of the second comparator of FIG. 1, corresponding to the output of the corresponding photodiode in section A of FIG. 2.

In this way a range of input analogue voltages from the source (2), for example within voltage range $V_1$ to $V_2$ in FIG. 2, can be represented to a 2 bit resolution using the arrangement of FIG. 1. The analogue voltage level will cause the laser (4) to emit an associated frequency which will generate an associated output strength in the signal from photodiodes (28, 30) dependent on the relative phase of the signals combined from the arms of the interferometers at couplers (14, 18). The amplitude of the output from the photodiodes will generate either a 1 or a 0 from the comparators (32, 34). Thus, the digital output from comparator (32) shown in FIG. 3a corresponds to the portion of the output from the photodiode (28) labelled (A) in FIG. 2. Similarly, the digital output from comparator (34) shown in FIG. 3b corresponds to the portion of the output from the photodiode (30) labelled (A) in FIG. 2. The parallel digital output derived from the comparators (32, 34), shown in the table in FIG. 3c, therefore comprises a 2 bit representation of a steadily increasing input analogue voltage from $V_1$ to $V_2$.

The tunable laser (4) could be of the type described in a paper entitled "Two section integrated quantum-confined stark effect tuned laser with uniform frequency modulation response from 30 kHz to 6 GHz" which was published in 1998 IEEE Int Topical Meeting on Microwave Photonics, Princeton, N.J., Oct. 12–14 1998, paper Tu C4. This laser provides a uniform frequency modulation response for the bandwidth 30 kHz to 6 GHz to 3 dB. The tuning range of this device is 22.5 GHz. However, it is believed that much greater tuning ranges are possible and such devices are under development.

The intensity, I, of the output optical signal from each interferometer is $$I \propto [1+\cos\{2\pi vt\}]$$

where t is the differential delay, and v is the frequency of the laser. If the laser is tuned about a centre frequency $v_0$ by $\pm\Delta v/2$ so that the two extremes of frequency to which the laser is tuned are:

$$v_1 = v_0 - \Delta v/2 \text{ and}$$

$$v_2 = v_0 + \Delta v/2,$$

then the change in phase generated by a differential delay (eg. delay (24) in interferometer (8)) for a change in frequency from $v_1$ to $V_2$ is therefore:

$$\Delta\phi = 2\pi t \Delta v$$

Figure 6:
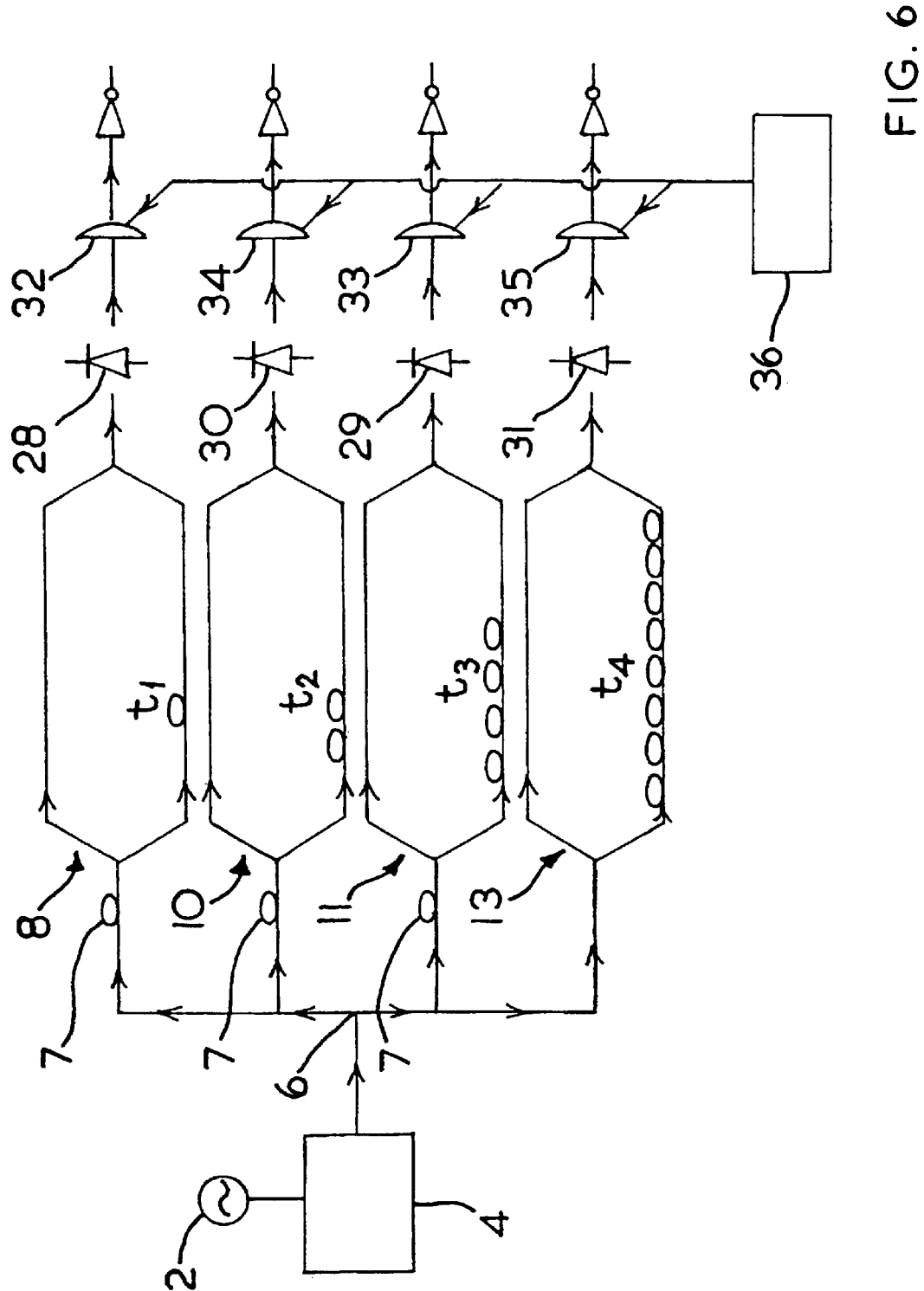
FIG. 6 shows schematically a four bit digital AND converter according to the present invention.

In FIG. 6 the arrangement of FIG. 1 is extended to include four Mach-Zehnder interferometers (with like parts labelled with like reference numerals). If the shortest time delay $t_1$ is chosen to generate a $\pi$ phase shift for a change in frequency from $v_1$ to $v_2$ then the shortest time delay will be;

$$t_1 = 1/2\Delta v$$

and successive time delays will be $t_2=2t_1$, $t_2=4t_1$, $t_3=8t_1$, etc. Thus, the value of $t_1$ and thus the speed of the A/D converter is dependent on the tuning range of the laser $\Delta v$.

Also, in this example to obtain a parallel digital Gray Code output from the comparators (32 to 35) the following condition should be met:

$v_1/\Delta v$ = an odd integer

Figure 8A:
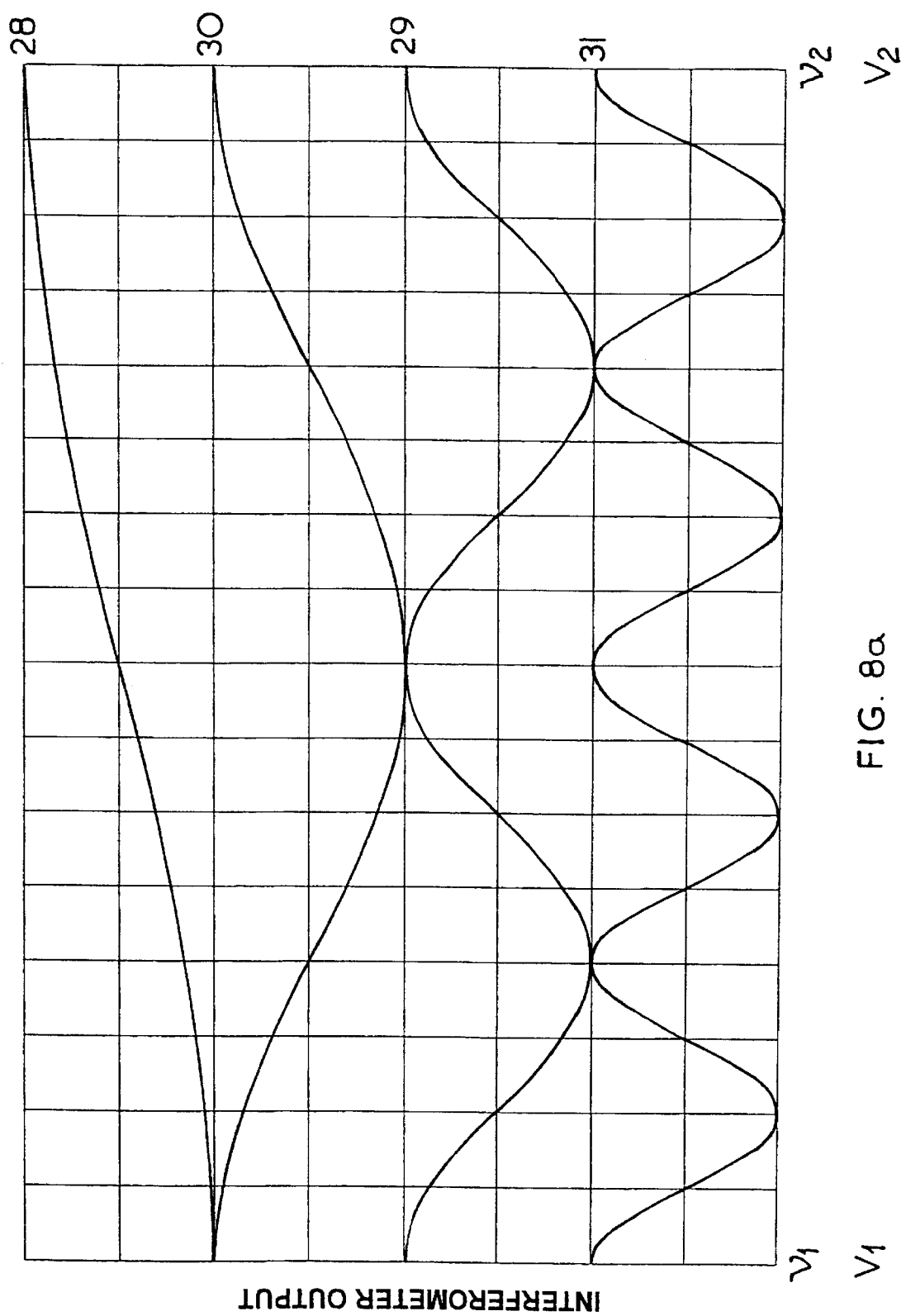
FIG. 8a shows the outputs generated by the four photodiodes of the arrangement shown in FIG. 6, when the differential delays are exact multiples of each other.

With the above time delays and with the above condition met, the sinusoidal response of successive interferometers (8, 10, 11, 13) as measured by successive photodiodes (28, 30, 29, 31) with linearly increasing frequency from $v_1$ to $v_2$ would take the forms shown in FIG. 8a (with each trace labelled with the number of the photodiode that generates it). It should be noted that the linearly increasing frequency from $v_1$ to $v_2$ corresponds to a linearly increasing input analogue voltage from $V_1$ to $V_2$, where an analogue input voltage $V_1$ generates an optical output from the laser (4) with frequency $v_1$ and an analogue input voltage $V_2$ generates an optical output from the laser (4) with frequency $v_2$.

By choosing $v_1/\Delta v$ to be an odd integer each of the traces in FIG. 8a starts at a maximum or a minimum. The output traces shown in FIG. 8a from the successive photodiodes in FIG. 6 can generate the binary outputs shown in FIG. 8b from the successive comparators (32, 34, 33, 35) (with the trace labelled 32 coming from comparator (32), etc), if the outputs from all of the photodiodes in FIG. 6 except photodiode (28) are inverted. The binary outputs of FIG. 8b generate the parallel digital Gray Code output of FIG. 8c. In practice the electrical outputs from the photodiodes (30, 29, 31) or the electrical outputs from the comparators (34, 33, 35) could be inverted to generate the Gray Code digital output.

The arrangement of FIG. 6 can be extended to provide higher bit resolution by adding further arms to the device, each comprising a further Mach-Zehnder interferometer (with an appropriate differential delay continuing the binary sequence), a photodiode and a comparator.

The digital Gray Code has the property that only one bit changes in going from one state to the next. To generate a Gray Code, starting from zero, each successive state is generated by changing the single least significant bit that brings about a new state, ie.

| Decimal | Gray Code | Decimal | Gray Code |
|---|---|---|---|
| 0 | 0000 | 8 | 1100 |
| 1 | 0001 | 9 | 1101 |
| 2 | 0011 | 10 | 1111 |
| 3 | 0010 | 11 | 1110 |
| 4 | 0110 | 12 | 1010 |
| 5 | 0111 | 13 | 1011 |
| 6 | 0101 | 14 | 1001 |
| 7 | 0100 | 15 | 1000 |

An alternative desired output could be a four bit parallel digital output in the Standard Binary Code representation, ie:

| Decimal | Standard Binary Code |
|---|---|
| 0 | 0000 |
| 1 | 0001 |
| 2 | 0010 |
| 3 | 0011, etc. |

Figure 4:
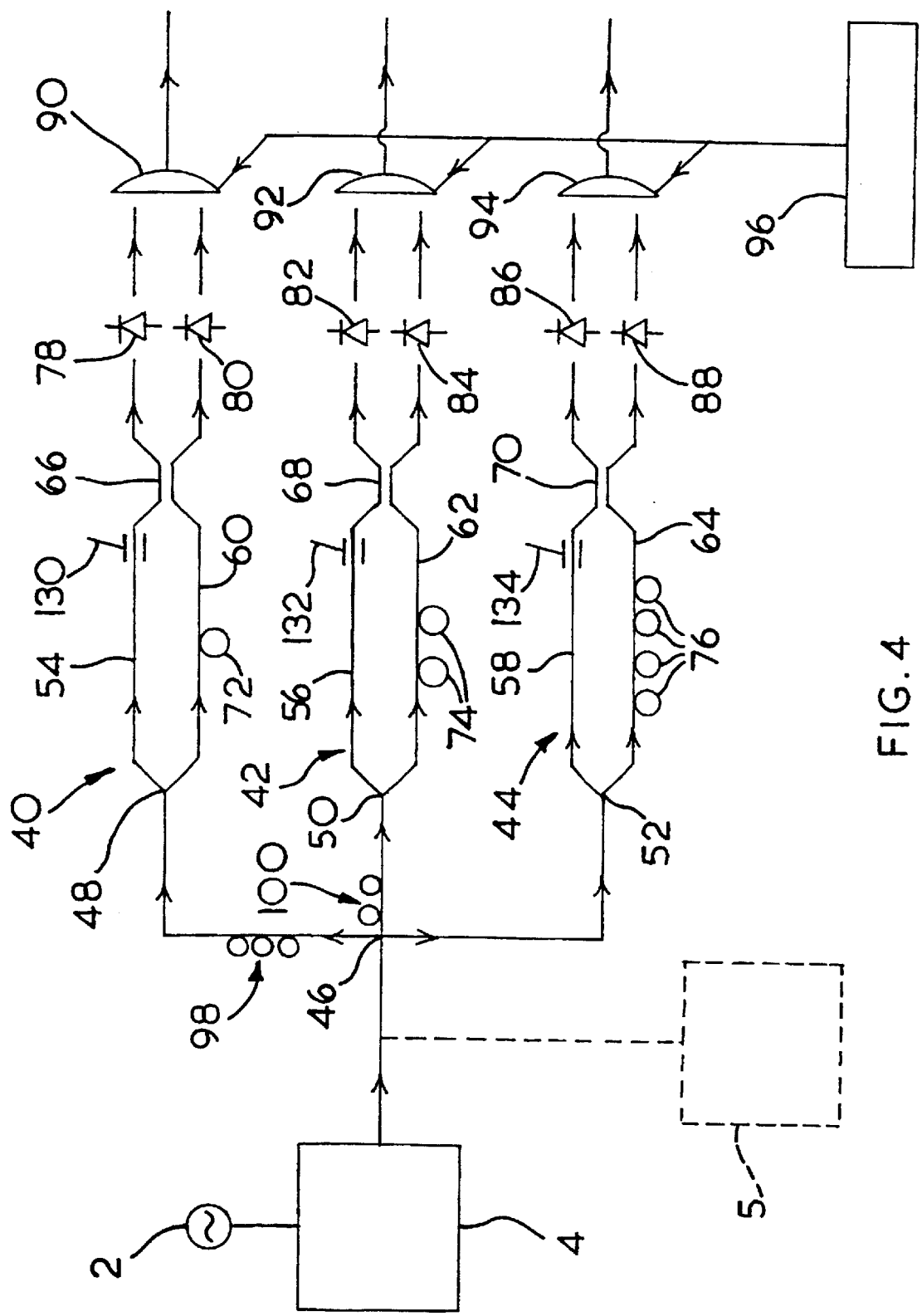
FIG. 4 shows schematically a three bit optical A/D converter according to the present invention.

FIG. 4 shows a second embodiment of an A/D converter according to the present invention. Again a tunable laser (4) is run continuously and is frequency modulated with an input analogue voltage from a voltage source (2). The output from the laser (4) is split into three interferometers (40, 42, 44) using a splitter (46) which preserves polarisation. Each Mach Zehnder interferometer (40, 42, 44) comprises a respective splitter (48, 50, 52) which preserves polarisation, a respective first arm (54, 56, 58), a respective second arm (60, 62, 64) and a respective coupled waveguide output (66, 68, 70). in this example, the first arms (54, 56, 58) of the interferometers have substantially the same length, whereas the second arms (60, 62, 64) have an increased length relative to their respective first arms to generate successive differential delays. The increase in successive differential delays doubles for successive interferometers (40, 42, 44). Thus, the delay in second arm (62) (represented by two loops (74)) is twice that in second arm (60) (represented by one loop (72)) and the delay in second arm (64) (represented by four loops (76)) is twice that in second arm (62).

The signals from the laser (4) input into interferometers (40, 42) are pre-delayed by delay lines (98) and (100) respectively in such a way that the signals arriving at photodiodes (78 to 88) have a substantially equal average delay. The delay lines (98, 100) may comprise optical fibres or may be implemented as waveguides in an integrated optic device. The successive differential delays $t_1$ to $t_3$ corresponding to successive loops (72) to (76) are selected to generate a 3 bit standard binary output, as shown in FIGS. 5a to 5d.

The outputs of the coupled waveguides (66, 68, 70) are each fed to a pair of respective matched photodiode detectors (78, 80), (82, 84) and (86, 88), which in turn feed respective comparators (90, 92, 94). Thus, as for the device of FIG. 1, the response of each interferometer (40, 42, 44) is periodic with the frequency of the output of the laser (4) and thus the analogue voltage level from source (2). The sinusoidal response of each interferometer goes through a full cycle for each change in laser frequency equal to the reciprocal of the time delay in the respective second arms (60, 62, 64). The two outputs from the coupled waveguides (66, 68, 70) are compared at comparators (90, 92, 94) to give the respective Standard Binary Code outputs shown in FIGS. 5a, 5b and 5c, which generate the parallel binary digital output of FIG. 5d.

The read out from the comparators (90, 92, 94) may be controlled by an external clock (96).

The use of the coupled waveguides (66, 68, 70) and matched detectors (78 to 88) makes the device shown in FIG. 4 preferred as it is insensitive to slow variations in the output power of the laser (4) and to imperfections in the splitters (48, 50, 52). Furthermore, integrated-optic phase shifters (130, 132, 134) which generate a phase change in an arm of the interferometers in response to an input voltage could be used to fine tune the relative delays in the interferometers (40, 42, 44). Integrated optic phase shifters (130, 132, 134) could comprise Silicon Dioxide on Silicon based phase shifters or electro-optic Lithium Niobate, Gallium Arsenide or Indium Phosphate based phase shifters.

The arrangement in FIG. 4 generates a three bit parallel digital output. The device can be extended to provide higher bit resolution by adding further arms of the device, each comprising a further Mach-Zehnder interferometer (with an appropriate successive delay continuing the binary sequence), a pair of matched detectors and a comparator.

In the arrangements shown in FIGS. 1, 4 and 6 the input analogue voltage has to drive only one laser (4) as opposed to an array of electro-optic shifters, as is the case in the known devices described above. The successive delays in the arms of the interferometers are reproducible in an accurate way and may be, for example, implemented using path length differences, for example in integrated optic Mach-Zehnder interferometers, or in optical fibres. In the arrangements of FIGS. 1, 4 and 6, the laser (4) is run continuously, which is a simplification over the mode locked operation used in some of the known optical A/D converters discussed above. Also, the clocks (39, 96) used in the arrangements of FIGS. 1, 4 and 6 can be derived externally, for example, from a quartz crystal oscillator, and so can be synchronised easily with other equipment.

In the devices according to the present invention there is a bandwidth limitation of the input signal due to the use of finite delays. The shortest such delays are minute, for example, the differential delay in the most significant bit (i.e. in interferometers (8 and 40)) can be approximately 0.15 picoseconds (corresponding to a pathlength difference of the order of 0.05 mm) for a laser operating at a wavelength of 1 micron with a tuning range of 10 nm. This differential delay is quite negligible, but the problem builds up rapidly as in successive interferometers the pathlength difference doubles. Thus, the device according to the present invention will have a trade-off between the speed and the resolution of the device. This is shown in the table in FIG. 10, which shows the theoretical maximum frequency achievable for increasing resolution for a Gray Code format. According to the well-known Nyquist theorem, the conversion rate of the analogue to digital converter will be at least twice the highest sampling frequency $f_{max}$.

It should be noted that the present invention will also have application in other forms of analogue to digital converters, such as oversampling A/D converters.

The arrangements of FIGS. 1, 4 and 6 which show the use of optical fibre delay lines, fibre couplers, photodiodes and comparators could be replaced by an integrated optic, for example an electro-optic circuit implemented on a single chip to provide a compact, robust and temperature stabilised implementation of the present invention. In such a device each interferometer would be implemented as waveguide structures formed in the device.

Figures 7, 8C, 10:
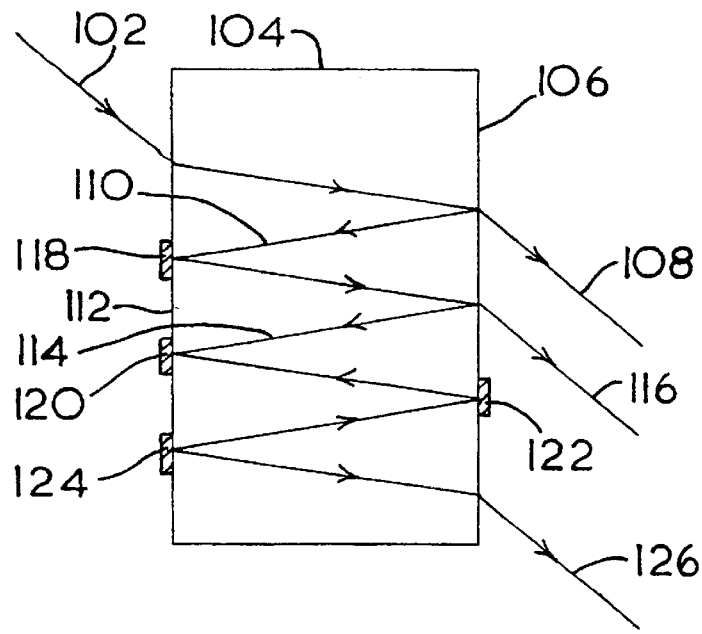
FIG. 7 shows schematically an alternative to the array of interferometers in FIGS. 1, 4 and 6 for generating a differential delay.
FIG. 8c shows the 4 bit Gray Code digital output derived from the comparators of the arrangement shown in FIG. 6.
FIG. 10 shows a table stating the theoretical performance that can be achieved for an A/D converter according to the present invention, assuming a 1% laser tuning range.
Figure 8B:
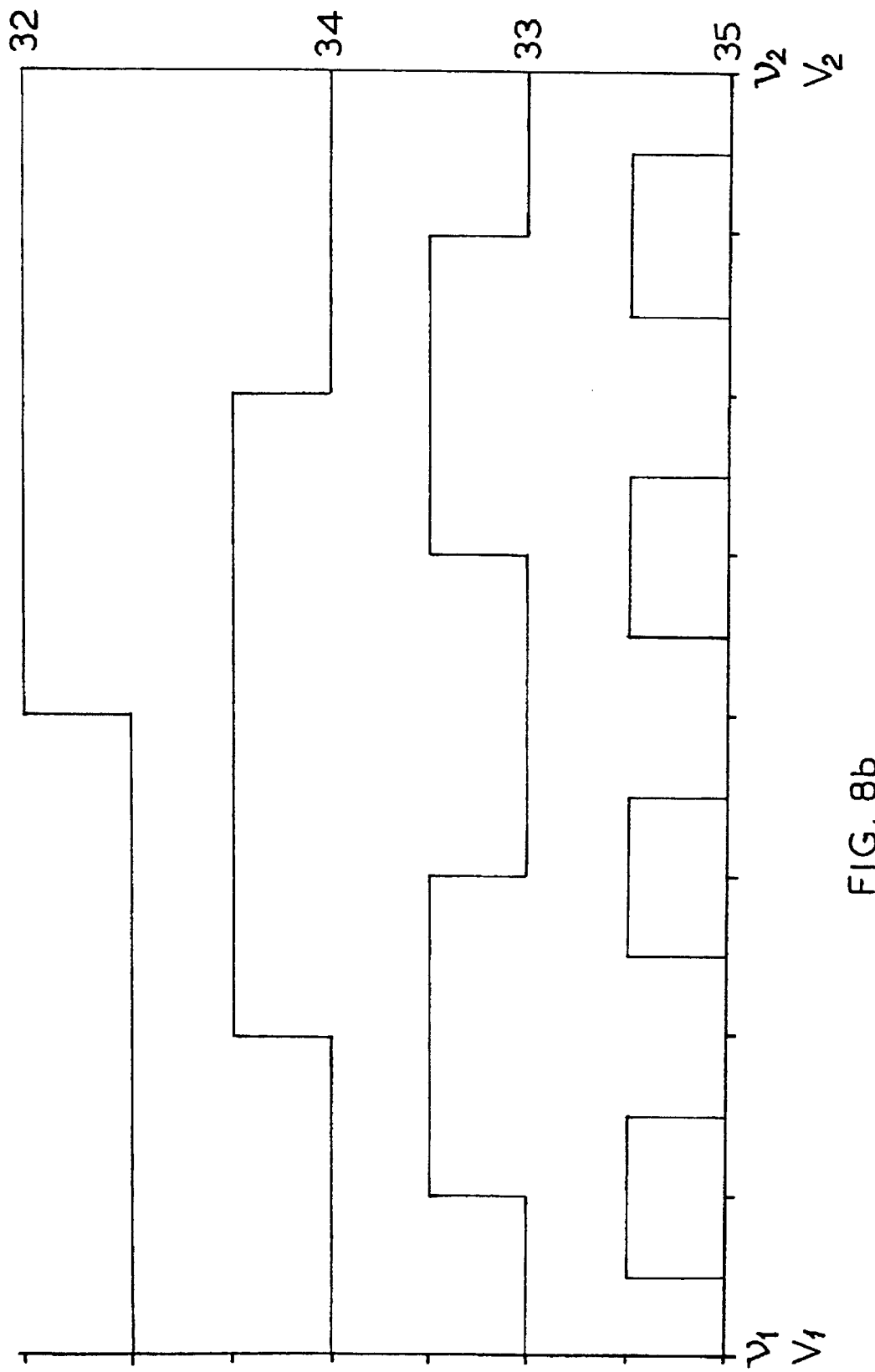

It is not essential to use a two arm interferometer structure in order to implement the present invention, by way of example an alternative scheme is shown in FIG. 7. Here the principle of total internal reflection could be used to generate successive delays in an input optical signal. A light beam (102) is directed onto a substrate (104), for example glass, and travels through the substrate and at the surface (106) some of the light will be reflected back into the substrate to form beam (110) and some will be transmitted to form beam (108) which will comprise an undelayed reference signal (equivalent to the signal from the first arms (54, 56, 58) of the interferometers (40, 42, 44) of the arrangement in FIG. 4). The reflected beam (110) will be reflected at the opposite surface (112) of the substrate (104) towards surface (106) by reflective coating (118). At surface (106) again some of the beam ((110) will be reflected back into the substrate (104) to form beam (114) and some will be transmitted to form beam (116) which is delayed relative to beam (108) by a single return path within the substrate (104). Using further reflective coatings (120, 122, 124) a third beam (126) is generated which is delayed relative to the beam (108) by a double return path within the substrate (104). Beams (108) and (116) and beams (108) and (126) can then be combined to generate sinusoidal outputs which are periodic with the input light frequency. The sinusoidal response from combining beams (108) and (116) will have a period twice that generated when beams (108) and (126) are combined. These sinusoidal outputs will be equivalent to those output from photodiodes (28) and (30) in FIG. 1 and can be converted into a digital form in the same way as in the arrangement of FIG. 1, using comparators.

The arrangements in FIGS. 1, 4 and 6 show the use of a parallel arrangement of differential delay Mach-Zehnder interferometers, however, the invention could equally be implemented using fewer, or a single, differential delay interferometer structure and tapping off signals from different parts of the arm of the interferometer(s) in which the differential delay is implemented, between successive delays in the said arm, in a way which is analogous to the disclosure in EP 0,319,286.

If the laser (4) and voltage source (2) of FIGS. 1 and 4 were replaced by a quazi-monochromatic light source (5) shown in dotted lines in FIGS. 1 and 4, then provided that the frequency of the light source (5) varies over an appropriate range the parallel digital output from the comparators would comprise a digital representation of the frequency of the light from the source (5). Thus, the arrangement according to the present invention has application as a digital optical wavemeter.

Figure 9:
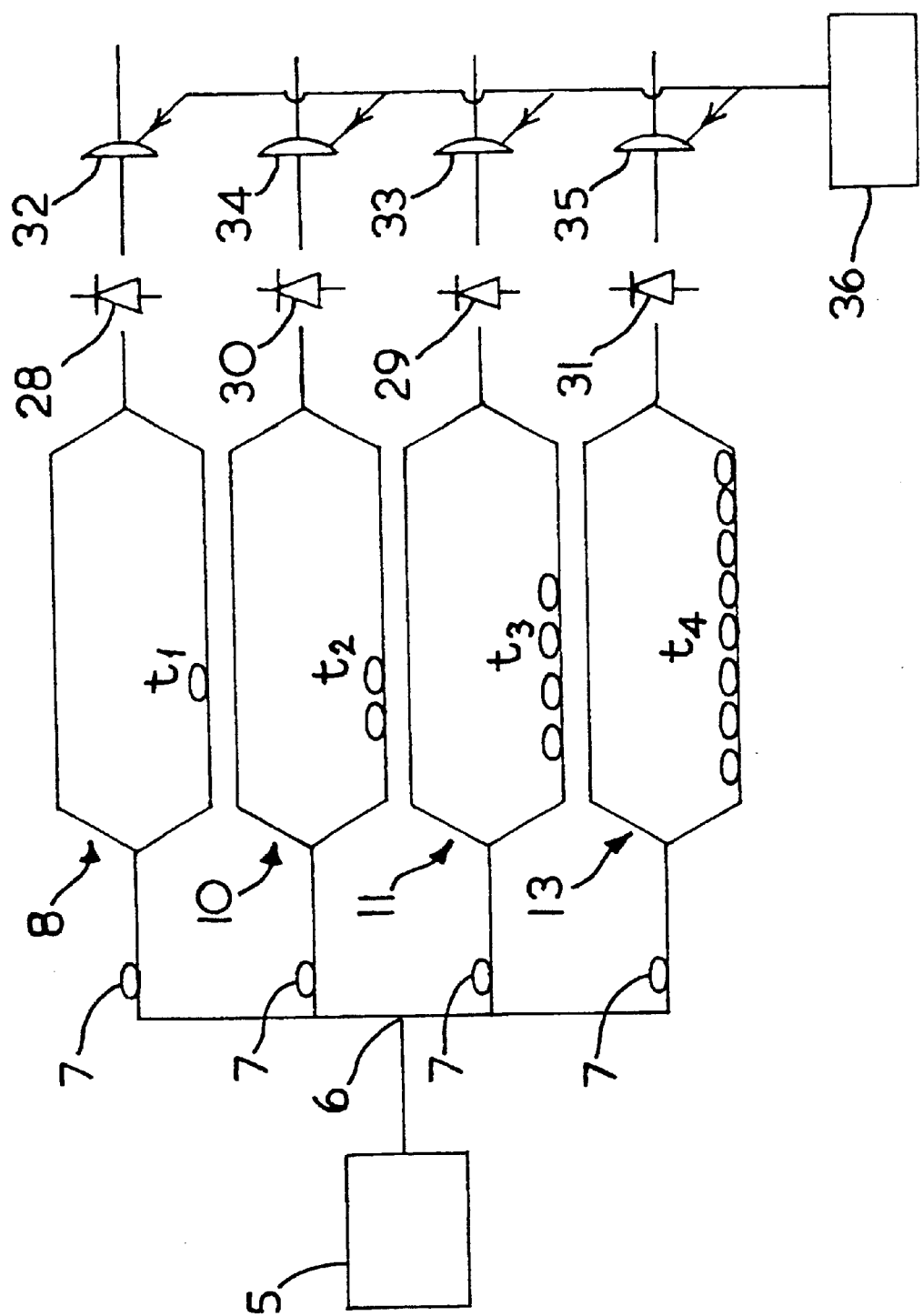
FIG. 9 shows a digital optical wavemeter according to the present invention.

Referring now to FIG. 9 which shows a digital optical wavemeter according to the present invention. FIG. 9 is similar to FIG. 6, with like numerals labelling like parts, except that source (2) and laser (4) have been replaced in FIG. 9 by a quasi-monochromatic light source (5) such as a singlemode laser diode, the output of which is to be measured by the wavemeter of FIG. 9. Thus, if it was desired to measure the stability of a light source (5) which is anticipated to operate at an average frequency of $v_0$ over a range between $v_1 = v_0 - \Delta v/2$ and $v_2 = v_0 + \Delta v/2$, to an accuracy of four bits then an arrangement, as shown in FIG. 9 could be used with differential delays in successive interferometers (8, 10, 11, 13) of;

$$t_1 = 1/2\Delta v,$$

$$t_2 = 1/\Delta v,$$

$$t_3 = 2/\Delta v,$$

and $$t_4 = 4/\Delta v,$$

provided the following condition is complied with;

$$v_1/\Delta v \text{ or } v2/\Delta v = \text{an integer}.$$

Once the average frequency of a source and the maximum expected variation of the frequency of the source is known a digital optical wavemeter, which will give, for example a parallel digital Gray Code output, can be constructed to as many bits as required using the methodology described above in relation to the A/D converter to calculate the required differential delays. The digital optical wavemeter according to the present invention could, for example be used to accurately measure the CHIRP of a quasi-monochromatic light source.

Figure 3C:
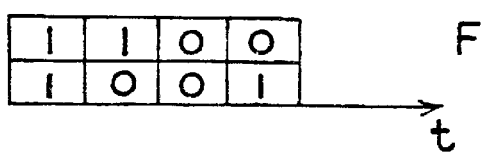
FIG. 3c shows the parallel digital output derived from the comparators of the arrangement of FIG. 1 which output comprises a 2 bit digital representation of the input analogue voltage level.
Figure 5A:
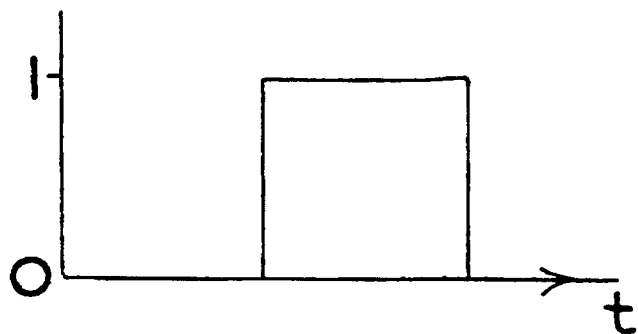
FIG. 5a shows the most significant bit (MSB) digital output of the first comparator of FIG. 4.
Figure 5B:
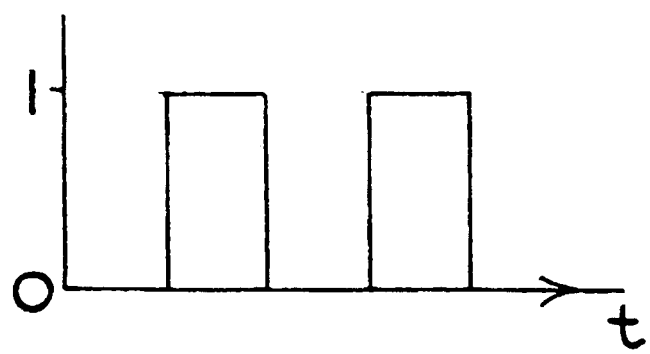
FIG. 5b shows the digital output of the second comparator of FIG. 4.
Figure 5C:
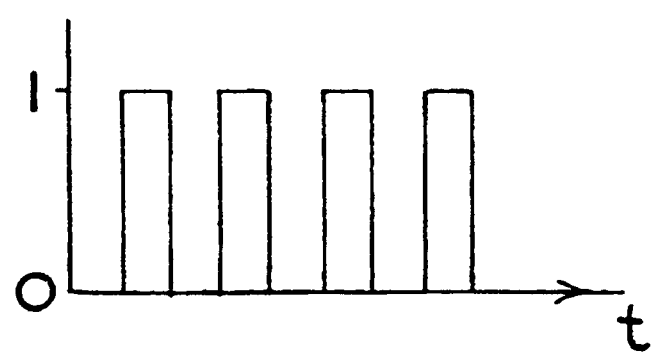
FIG. 5c shows the least significant bit (LSB) digital output of the third comparator of FIG. 4.
Figure 5D:
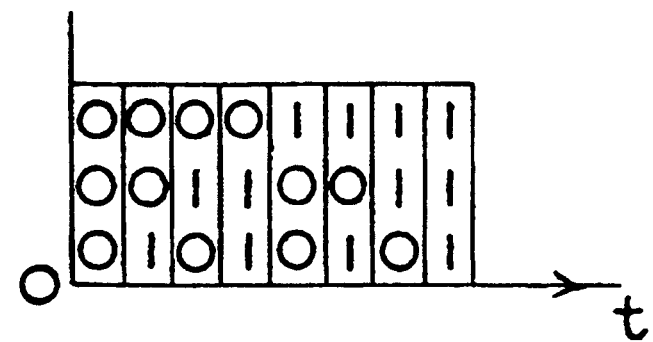
FIG. 5d shows the parallel Standard Binary Code three bit digital output derived from the comparators of the arrangement of FIG. 4 which represents the input analogue voltage level.

While Gray Code digital outputs have been discussed above an A/D converter or digital optical wavemeter according to the present invention could be implemented to give alternatively coded digital outputs, such as standard binary code as shown in FIG. 5d or the code shown in FIG. 3c.

Where a Gray Code output is obtained from an optical analogue to digital converter or a digital optical wavemeter described above, it may be possible to correct errors in the output using the method of digital error correction described in a paper entitled "Real-Time Digital Error Correction for Flash Analog-To-Digital Converter" which was published in IEEE Transactions on Applied Semiconductivity, Volume 7, No. 2, June 1997.

What is claimed is:

1. An optical analogue to digital (A/D) converter for converting an input analogue voltage signal into a digital output, comprising:
    means for frequency modulating an optical signal with an input analogue voltage signal,
    delay means for splitting the frequency modulated optical signal and generating at least one differentially delayed signal and at least one reference signal,
    at least one combining means arranged to combine the or each delayed optical signal with the or one of the reference signal(s), and
    at least one converter means for converting a combined signal output from an associated one of the combining means to a digital output.

2. A converter according claim 1 wherein the delay means comprises at least one interferometer having a first arm for generating a reference signal and a second arm for generating at least one differentially delayed signal.

3. A converter according to claim 2 wherein the output of each interferometer comprises a coupled waveguide output.

4. A converter according to claim 3 wherein the delay means comprises a plurality of interferometers each having a first arm for generating a reference signal and a second arm for generating a differentially delayed signal.

5. A converter according to claim 4 wherein the two outputs of the coupled waveguide are detected by separate photodiode detectors.

6. A converter according to claim 5 wherein the output of the separate photodiode detectors are compared with each other by a comparator to generate a "0" or a "1".

7. A converter according to claim 3 wherein the two outputs of the coupled waveguide are detected by separate photodiode detectors.

8. A converter according to claim 7 wherein the output of the separate photodiode detectors are compared with each other by a comparator to generate a "0" or a "1".

9. A converter according to claim 2 wherein the delay means comprises a plurality of interferometers each having a first arm for generating a reference signal and a second arm for generating a differentially delayed signal.

10. A converter according to claim 1 wherein each successive differential delay is substantially double the previous delay.

11. A converter according to claim 10 wherein the successive differential delays, $t_1, t_2, t_3, t_4 \ldots t_n$ are as follows:

$$t_1 = 1/2\Delta v$$

$$t_2 = 1/\Delta v$$

$$t_3 = 2/\Delta v$$

$$t_4 = 4/\Delta v$$

and $v_1/\Delta v$ or $v_2/\Delta v$ is an integer, where $v_1 = v_0 - \Delta v/2$, $v_2 = v_0 + \Delta v/2$, $v_0$ = the central frequency of the frequency modulated optical signal, $\Delta v$ = the variation in frequency about the central frequency of the frequency modulated optical signal.

12. A converter according to claim 1 wherein each converter means generates a one bit digital output.

13. A converter according to claim 1 wherein each converter means comprises at least one comparator means for comparing an associated combined signal to a reference value and generating a "0" or a "1".

14. A converter according to claim 1 wherein the means for frequency modulating an optical signal with an input analogue voltage signal comprises a frequency tunable laser which generates an optical signal with a frequency related to the input analogue voltage tuning signal.

15. A converter according to claim 1 wherein the delay means comprises at least one electro-optic phase shifter for fine tuning of differentially delayed signals and/or reference signals.

16. A converter according to claim 1 wherein compensatory delay means are included to compensate for the delays generated by the delay means, such that the combined signals are input into the converting means substantially simultaneously.

17. A converter according to claim 1 wherein at least part of the device is integrated onto an integrated optic substrate.

18. A converter according to claim 1 where there is more than one combining means and the combined signal outputs from the combining means have different frequencies.

19. A method of analogue to digital (A/D) conversion, comprising the steps of;
    frequency modulating an optical signal with an Input analogue voltage signal,
    splitting the frequency modulated optical signal and generating at least one differentially delayed optical signal and at least one reference signal,
    combining the or each of the delayed optical signal with the or one of the reference signal(s) to generate a combined signal or signals, and converting the or each combined signal into a digital signal.

20. A method according to claim 19 comprising the step of using at least one interferometer having a first arm for generating a reference signal and a second arm for generating at least one differentially delayed signal.

21. A method according to claim 20 comprising the step of using a plurality of interferometers each having a first arm for generating a reference signal and a second arm for generating a differentially delayed signal.

22. A method according to claim 19 wherein each successive differential delay is substantially double the previous delay.

23. A method according to claim 22 wherein the successive differential delays, $t_1, t_2, t_3, t_4 \ldots$ are as follows:

$$t_1 = 1/2\Delta v$$
$$t_2 \, 1/\Delta v$$
$$t_3 = 2/\Delta v$$
$$t_4 = 4/\Delta v$$
$$t_n = 2^{n-2}/\Delta v$$

and $v_1/\Delta v$ or $v_2/\Delta v$ is an integer,
where $v_1 = v_0 - \Delta v/2$,
   $v_2 = v_0 + \Delta v/2$,
   $v_0$ = the central frequency of the frequency modulated optical signal, and
   $\Delta v$ = the variation in frequency about the central frequency of the frequency modulated optical signal.

24. A method according to claim 19 comprising the step of converting each combined signal into a one bit digital signal.

25. A method according to claim 19 wherein the step of converting the or each combined signal into a digital signal comprises the step of comparing the or each of the combined signals with a reference value and generating a "0" or a "1", depending on the result of the comparison.

26. A method according to claim 19 comprising the step of using a frequency tunable laser responsive to an input analogue voltage to generate the frequency modulated optical signal.

27. A method according to claim 19 wherein the combined signals have different frequencies.

28. A digital optical wavemeter for generating a digital representation of the frequency of an input optical signal, comprising:
   delay means for splitting the input optical signal and generating at least one differentially delayed optical signal and at least one reference signal,
   at least one combining means arranged to combine the or each delayed optical signal with the or one of the reference signal(s), and
   at least one converter means for converting a combined signal output from an associated one of the combining means to digital output.

29. A wavemeter according to claim 28 wherein the delay means comprises at least one interferometer having a first arm for generating a reference signal and a second arm for generating at least one differentially delayed signal.

30. A wavemeter according to claim 29 wherein the output of said at least one interferometer comprises a coupled waveguide output.

31. A wavemeter according to claim 30 wherein the delay means comprises a plurality of interferometers each having a first arm for generating a reference signal and a second arm for generating a differentially delayed signal.

32. A wavemeter according to claim 31 wherein the two outputs of the coupled waveguide are detected by separate photodiode detectors.

33. A wavemeter according to claim 32 wherein the outputs of the separate photodiode detectors are compared with each other by a comparator means to generate a "0" or a "1", depending on the result of the comparison.

34. A wavemeter according to claim 30 wherein the two outputs of the coupled waveguide are detected by separate photodiode detectors.

35. A wavemeter according to claim 34 wherein the outputs of the separate photodiode detectors are compared with each other by a comparator means to generate a "0" or a "1", depending on the result of the comparison.

36. A wavemeter according to claim 29 wherein the delay means comprises a plurality of interferometers each having a first arm for generating a reference signal and a second arm for generating a differentially delayed signal.

37. A wavemeter according to claim 28 wherein each successive differential delay is substantially double the previous delay.

38. A wavemeter according to claim 37 wherein the successive differential delays, $t_1, t_2, t_3, t_4 \ldots$ are as follows:

$$t_1 = 1/2\Delta v$$
$$t_2 \, 1/\Delta v$$
$$t_3 = 2/\Delta v$$
$$t_4 = 4/\Delta v$$
$$t_n = 2^{n-2}/\Delta v$$

and $v_1/\Delta v$ or $v_2/\Delta v$ is an integer,
where $v_1 = v_0 - \Delta v/2$,
   $v_2 = v_0 + \Delta v/2$,
   $v_0$ = the central frequency of the frequency modulated optical signal, and
   $\Delta v$ = the variation in frequency about the central frequency of the input optical signal.

39. A wavemeter according to claim 28 wherein each converter means generates a one bit digital output.

40. A wavemeter according to claim 28 wherein each converter means comprises at least one comparator means for comparing an associated combined signal to a reference value and generating a "0" or a "1".

41. A wavemeter according to claim 28 wherein the delay means comprises at least one electro-optic phase shifter for fine tuning of differentially delayed signals and/or reference signals.

42. A wavemeter according to claim 28 wherein additional delay means are included to compensate for the delays generated by the delay means, such that the combined signals are input into the converter means substantially simultaneously.

43. A wavemeter according to claim 28 wherein at least part of the device is integrated onto an integrated-optic substrate.

44. A wavemeter according to claim 28 where there is more than one combining means and wherein the combined signal outputs from the combining means have different frequencies.

45. A method for generating a digital representation of the wavelength of an input optical signal, comprising the steps of:
   splitting the input optical signal and generating at least one differentially delayed signal and at least one reference signal,
   combining the or each of the differentially delayed signal with the or one of the reference signal(s) to generate at least one combined signal, and
   converting the or each combined signal into a digital signal.

46. A method according to claim 45 comprising the step of using at least one interferometer having a first arm for generating a reference signal and a second arm for generating at least one differentially delayed signal.

47. A method according to claim 46 comprising the step of using a plurality of interferometers each having a first arm for generating a reference signal and a second arm for generating a differentially delayed signal.

48. A method according to claim 45 wherein each successive differential delay is substantially double the previous delay.

49. A method according to claim 48 wherein the successive differential delays, $t_1$, $t_2$, $t_3$, $t_4$ .... $t_n$ are as follows:

$t_1 = 1/2\Delta v$ $t_2 1/\Delta v$ $t_3 = 2/\Delta v$ $t_4 = 4/\Delta v$ $t_n = 2^{n-2}/\Delta v$ where $v_1 = v_0 - \Delta v/2$, $v_1 = v_0 - \Delta v/2$, $v_0$ = the central frequency of the frequency modulated optical signal, and $\Delta v$ = the variation in frequency about the central frequency of the input optical signal.

50. A method according to claim 45 comprising the step of converting each combined signal into a one bit digital signal.

51. A method according to claim 45 in which the step of comparing the or each of the combined signal into a digital signal comprises the step of comparing the or each of the combined signals with a reference value and generating a 0 or a 1, depending on the result of the comparison.

52. A method according to claim 45 wherein the combined signals have different frequencies.

* * * * *